United States Patent
Shlick et al.

(10) Patent No.: US 8,891,301 B1
(45) Date of Patent: Nov. 18, 2014

(54) POWER DROP PROTECTION FOR A DATA STORAGE DEVICE

(71) Applicant: Sandisk Technologies Inc., Plano, TX (US)

(72) Inventors: Mark Shlick, Ganey-Tikva (IL); Mark Murin, Kfar-Saba (IL); Menahem Lasser, Kohav-Yair (IL)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/285,433

(22) Filed: May 22, 2014

Related U.S. Application Data

(63) Continuation of application No. 14/062,534, filed on Oct. 24, 2013.

(51) Int. Cl.
 *G11C 16/04* (2006.01)
 *G11C 16/10* (2006.01)

(52) U.S. Cl.
 CPC .......... *G11C 16/105* (2013.01); *G11C 16/0483* (2013.01)
 USPC ............. 365/185.03; 365/185.12; 365/185.18

(58) Field of Classification Search
 CPC ............... G11C 16/10; G11C 16/0483; G11C 2213/71; G11C 11/5628; G11C 11/5642; G11C 11/5621; G11C 2211/5621
 USPC ............. 365/185.03, 185.12, 185.18, 185.24
 See application file for complete search history.

(56) References Cited

U.S. PATENT DOCUMENTS

| | | | |
|---|---|---|---|
| 8,462,549 B2 * | 6/2013 | Haratsch et al. | ......... 365/185.03 |
| 2007/0159888 A1 | 7/2007 | Tu et al. | |
| 2011/0044105 A1 | 2/2011 | Lim et al. | |
| 2011/0273926 A1 | 11/2011 | Wu et al. | |
| 2012/0008397 A1 | 1/2012 | Shin et al. | |

FOREIGN PATENT DOCUMENTS

WO  2010011692 A1  1/2010

* cited by examiner

*Primary Examiner* — David Lam
(74) *Attorney, Agent, or Firm* — Toler Law Group, PC

(57) ABSTRACT

A data storage device includes a non-volatile memory that includes a three-dimensional (3D) memory and circuitry associated with operation of memory cells of the 3D memory. A method includes programming a first page at a word line of the non-volatile memory. While programming a second page at the word line, first storage elements of the word line are selectively programmed in response to a power drop at the data storage device to increase a state separation that separates data values of the first page.

20 Claims, 4 Drawing Sheets

US 8,891,301 B1

POWER DROP PROTECTION FOR A DATA STORAGE DEVICE

REFERENCE TO EARLIER-FILED APPLICATIONS

This application is a continuation of and claims priority to U.S. Non-Provisional patent application Ser. No. 14/062,534, filed Oct. 24, 2013, the contents of which are incorporated by reference herein in their entirety.

FIELD OF THE DISCLOSURE

The present disclosure is generally related to data storage devices and more specifically to power drop protection for data storage devices.

BACKGROUND

Non-volatile data storage devices, such as embedded memory devices and removable memory devices, have enabled increased portability of data and software applications. For example, multi-level cell (MLC) flash memory devices may store multiple bits in each flash memory cell, enhancing data storage density. Data stored at such devices may be encoded using error correcting coding (ECC) techniques that protect the data from errors associated with power supply noise, temperature variations, and other causes of data corruption. In some cases, the ECC techniques may be insufficient to recover corrupted data. For example, data corruption may exceed an ECC capability associated with the particular ECC technique used to encode the data, causing data loss.

SUMMARY

Techniques are disclosed to enable recovery of data at a data storage device in case of a power drop of a power supply voltage of the data storage device that could corrupt the data. In a particular configuration, a word line of the data storage device stores multiple logical pages, such as a first logical page and a second logical page. For example, the word line may include storage elements having a multi-level cell (MLC) configuration, and the first logical page and the second logical page may respectively correspond to lower page data (e.g., a "0" bit in a "10" number) and upper page data (e.g., a "1" bit in the "10" number) that can be stored at the word line. If a power drop in the power supply voltage occurs at the data storage device after the data storage device writes the first logical page at the word line and while writing the second logical page at the word line, certain data values at the word line may be unrecoverable using error correcting coding (ECC) techniques. For example, data values associated with the upper page data may "overlap" (and be indistinguishable from) data values associated with the lower page data due to incompletion of writing the second page, potentially resulting in data loss.

To enable recovery of data in case of a power drop, certain devices may back up lower page data prior to writing upper page data. If a power drop occurs while writing the upper page data, corrupted bits of the lower page data can be recovered from the backed up lower page data. However, such a technique may utilize a large amount of memory and processing resources to back up the lower page data, reducing system performance. Other techniques may shift data to an "intermediate" distribution, such as a "low-to-middle" (LM) state to "B" state (LMB) distribution, to reduce overlap of state distributions in case of a power drop. A "BC first" (BCF) technique may program "B" states and "C" states prior to programming "A" states. Such techniques may enable data recovery in case of a power drop, but may be associated with performance degradation due to an increased number of write operations at the devices. For example, these techniques may be applied in response to initiating a write operation, irrespective of whether or not a power drop occurs during the write operation.

An example data protection technique in accordance with the present disclosure selectively programs storage elements of a word line in response to a power drop at the data storage device to increase a state separation that separates data values of a lower page. The increased state separation may enable recovery of the lower page by preventing or reducing overlap between distributions that indicate different data values of the lower page. Advantageously, the data protection technique may be selectively applied, improving efficiency as compared to conventional devices that always perform recovery techniques whether or not the recovery techniques are needed (e.g., irrespective of whether or not a power drop occurs). Accordingly, the data protection technique may be applied in response to a power drop instead of prior to a power drop, improving system performance and reducing backup data overhead while enabling data recovery.

DETAILED DESCRIPTION

Figure 1:
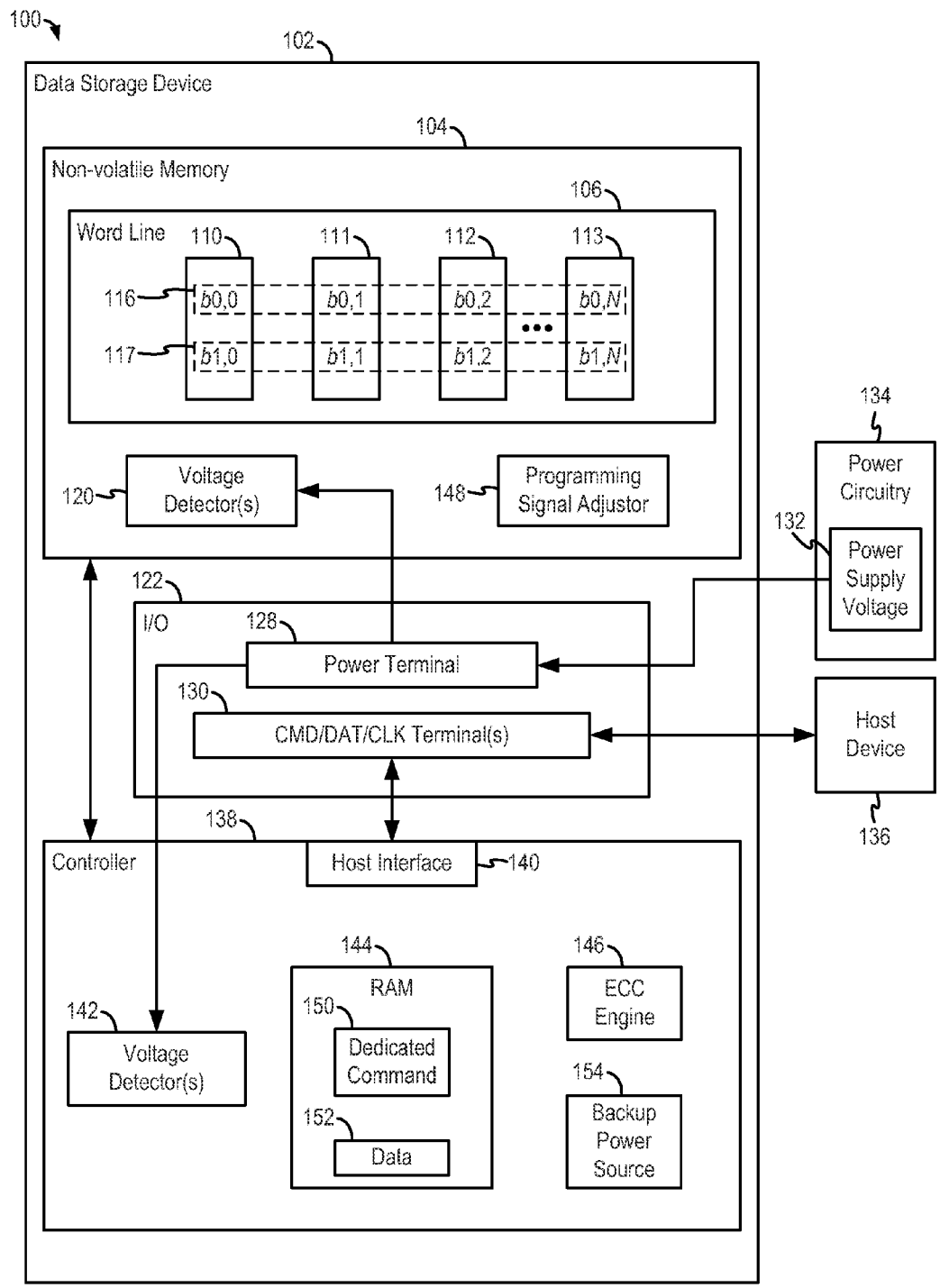
FIG. 1 is a block diagram of a particular illustrative embodiment of a system including a data storage device configured to selectively program storage elements in response to a power drop.

FIG. 1 is a block diagram of a particular illustrative embodiment of a system 100 that includes a data storage device 102, power circuitry 134, and a host device 136. The data storage device 102 may be embedded within the host device 136, such as in accordance with an embedded Multi-Media Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 136. For example, the data storage device 102 may be removably coupled to the host device 136 in accordance with a removable universal serial bus (USB) configuration. The power circuitry 134 may be integrated within the host device 136 or may be external to the host device 136, as depicted in the example of FIG. 1.

To further illustrate, the data storage device 102 may be configured to be coupled to the host device 136 as embedded memory, such as in connection with an eMMC configuration, as an illustrative example. The data storage device 102 may correspond to an eMMC device. As another example, the data storage device 102 may correspond to a memory card, such as a Secure Digital (SDC) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact- Flash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a non-volatile memory 104, an input/output (I/O) portion 122, and a controller 138. In a particular illustrative embodiment, the non-volatile memory 104 includes a flash memory, such as a NAND flash memory or a NOR flash memory. In other implementations, the non-volatile memory 104 may include an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104, the I/O portion 122, and the controller 138 may be coupled via one or more buses, one or more interfaces, one or more other structures, or a combination thereof.

The non-volatile memory 104 may include a programming signal adjustor 148, one or more word lines, and one or more voltage detectors. In the example of FIG. 1, the non-volatile memory 104 includes a word line 106 and a voltage detector 120. In a particular embodiment, the word line 106 has a multi-level cell (MLC) configuration. For example, the word line 106 may include storage elements 110, 111, 112, and 113 that are each configured to store multiple logical data values in response to selection and programming by the controller 138.

To illustrate, the controller 138 may select the storage element 110 to store a threshold voltage that indicates bit values b0,0 and b1,0 and may program the storage element 110 to store the threshold voltage. The controller 138 may select the storage element 111 to store a threshold voltage that indicates bit values b0,1 and b1,1 and may program the storage element 111 to store the threshold voltage. The controller 138 may select the storage element 112 to store a threshold voltage that indicates bit values b0,2 and b1,2 and may program the storage element 112 to store the threshold voltage. The controller 138 may select the storage element 113 to store a threshold voltage that indicates bit values b0,N and b1,N and may program the storage element 113 to store the threshold voltage. N indicates a number of storage elements included in the word line 106 (e.g., 512, 1024, or any other positive integer that is greater than one). Although the particular example of FIG. 1 illustrates a two-bit-per-cell ("X2") configuration, it should be appreciated that one or more techniques described herein may be applicable to other configurations, such as a three-bit-per-cell ("X3") configuration.

The word line 106 may be configured to store multiple logical pages of data in connection with an MLC configuration. For example, the word line 106 may be configured to store a page 116 and a page 117. The page 116 may include a first set of bits stored at the word line 106, and the page 117 may include a second set of bits stored at the word line 106. In a particular embodiment, the pages 116, 117 correspond to a lower page and an upper page, respectively. Lower pages and upper pages are described further with reference to FIG. 2.

The I/O portion 122 may include a power terminal 128 and one or more other terminals, such as one or more command, data, and/or clock terminals 130. The power terminal 128 may be responsive to a power supply voltage 132. The power terminal 128 may supply a voltage, based on the power supply voltage 132, to one or more components of the data storage device 102, such as to the non-volatile memory 104 and to the controller 138. The one or more command, data, and/or clock terminals 130 may communicate commands, command responses, and/or data between the host device 136 and the controller 138.

The controller 138 may include a host interface 140, one or more voltage detectors (e.g., a voltage detector 142), a random access memory (RAM) 144, an error correcting code (ECC) engine 146, and a backup power source 154. The controller 138 is coupled to the non-volatile memory 104 via one or more buses, one or more interfaces, one or more other structures, or a combination thereof. The controller 138 is configured to send a read command to read data from a specified address of the non-volatile memory 104. The controller 138 is configured to send data and a write command to cause the non-volatile memory 104 to store the data to a specified address of the non-volatile memory 104. To further illustrate, the controller 138 may send data and one or more write commands to cause the non-volatile memory 104 to store the pages 116, 117 at the word line 106. The controller 138 may send a read command to read one or both of the pages 116, 117 from the word line 106.

The host device 136 may correspond to a mobile telephone, a music player, a video player, a gaming console, an electronic book reader, a personal digital assistant (PDA), a computer, such as a laptop computer, tablet, or notebook computer, another electronic device, or a combination thereof. The host device 136 may communicate via a host controller, which may enable the host device 136 to read data from the non-volatile memory 104 and to write data to the non-volatile memory 104. The host device 136 may operate in compliance with a JEDEC Solid State Technology Association industry specification, such as an eMMC specification or a UFS Host Controller Interface specification. The host device 136 may operate in compliance with one or more other specifications, such as a Secure Digital (SD) Host Controller specification as an illustrative example. The host device 136 may communicate with the non-volatile memory 104 in accordance with another suitable communication protocol.

In operation, the controller 138 may receive data and instructions from the host device 136 and may send data to the host device 136. The controller 138 may send data and commands to the non-volatile memory 104 and may receive data from the non-volatile memory 104. As a particular example, the controller 138 may receive data 152 from the host device 136 via the host interface 140. The data 152 may correspond to user data (e.g., a file, or a portion of a file) that is to be stored at the non-volatile memory 104.

The ECC engine 146 may be configured to receive the data 152 and to generate one or more ECC codewords based on the data 152. For example, the ECC engine 146 may include an encoder configured to encode the data 152 using an ECC encoding technique. The ECC engine 146 may include a Reed-Solomon encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The ECC engine 146 may include a decoder configured to decode data read from the non-volatile memory 104 to detect and correct, up to an error correction capability of an ECC technique used by the ECC engine 146, bit errors that may be present in the read data.

To further illustrate, the ECC engine 146 may receive the data 152 from the RAM 144. The ECC engine 146 may generate one or more ECC codewords based on the data 152. In a particular embodiment, the pages 116, 117 correspond to ECC codewords generated by the ECC engine 146 based on the data 152. The pages 116, 117 may be written to the word line 106 non-simultaneously, such as in connection with a multi-stage write operation that writes multiple logical pages to a particular word line of the non-volatile memory 104 using multiple write commands sent from the controller 138 to the non-volatile memory 104. For example, the page 116 may be written at a first time in response to a first write command sent from the controller 138 to the non-volatile memory 104, and the page 117 may be written at a second time in response to a second write command sent from the controller 138 to the non-volatile memory 104. Alternatively or in addition, the pages 116, 117 may be written to the non-volatile memory 104 using one or more other techniques.

If a power drop occurs after programming the page 116 at the word line 106 and while programming the page 117 at the word line 106, the data storage device 102 may increase a state separation that separates data values of the page 116. For example, the data storage device 102 may selectively program one or more of the storage elements 110-113, such as by continuing to program one or more of the storage elements 110-113 that store and/or that are scheduled to store a first data value of the page 116 (e.g., a "0" data value) and by inhibiting programming of one or more of the storage elements 110-113 that store and/or that are scheduled to store a second data value of the page 116 (e.g., a "1" data value). Example techniques for increasing a state separation at the data storage device 102 are described further with reference to FIG. 2. In response to the power drop, the controller 138 may be inhibited from sending additional commands to the non-volatile memory 104 until power increases (e.g., upon power-up of the data storage device 102).

The power drop may occur in response to a power-down event at the data storage device 102. For example, in response to the host device 136 initiating an "off" or "standby" mode of operation, the power terminal 128 may be decoupled from the power supply voltage 132, resulting in a power drop. The power drop may be detected in a manner illustrated by one or more of the examples described below.

According to a first example, the voltage detector 120 is configured to detect the power drop. For example, because the voltage detector 120 is coupled to the power terminal 128, the voltage detector 120 may be responsive to changes in a voltage at the power terminal 128. In a particular embodiment, if the voltage detector 120 detects that the voltage is less than a first threshold (e.g., is less than a particular threshold voltage level needed to safely write data to the non-volatile memory 104) while the page 117 is being programmed at the word line 106, the voltage detector 120 causes the data storage device 102 to increase the state separation that separates data values of the page 116. For example, the voltage detector 120 may generate a signal that causes the non-volatile memory 104 to continue programming storage elements of the word line 106 that store or are scheduled to store a first data value of the page 116 (e.g., a "0" data value). Alternatively or in addition, the signal may cause the non-volatile memory 104 to inhibit programming of storage elements of the word line 106 that store or are scheduled to store a second data value of the page 116 (e.g., a "1" data value).

According to a second example, the voltage detector 142 of the controller 138 is configured to detect the power drop at the power terminal 128. In response to the voltage detector 142 detecting the power drop, the controller 138 may send a write protect signal to the non-volatile memory 104. The write protect signal may cause the non-volatile memory 104 to increase a state separation that separates data values of the page 116. For example, the non-volatile memory 104 may be configured to increase the state separation in response to receiving the write protect signal from the controller 138. In a particular embodiment, the write protect signal is a "general purpose" write protect signal.

According to a third example, the voltage detector 142 of the controller 138 is configured to detect the power drop, and the controller 138 is configured to send a dedicated command 150 to the non-volatile memory 104 in response to the voltage detector 142 detecting the power drop. The dedicated command 150 may instruct the non-volatile memory 104 to increase the state separation that separates data values of the first page. In a particular embodiment, the dedicated command 150 is reserved for instructing the non-volatile memory 104 to increase a state separation in response to a power drop. The dedicated command 150 is distinct from a general purpose command (e.g., a general purpose write protect command).

In response to the power drop, the programming signal adjustor 148 may adjust a programming signal used to selectively program one or more of the storage elements 110-113. The programming signal may be adjusted by modifying a number of programming pulses of the programming signal, by modifying a magnitude of the programming pulses, by modifying a duration of the programming pulses, or a combination thereof. For example, the programming signal adjustor 148 may adjust the programming signal by increasing a number of programming pulses of the programming signal, by increasing a magnitude of one or more of the programming pulses, by decreasing a duration of one or more of the programming pulses, or a combination thereof. Alternatively or in addition, one or more of the storage elements 110-113 may be selectively programmed without using a verify signal in order to save time and/or power that can be used to further selectively program one or more of the storage elements 110-113. As described further with reference to FIG. 2, the programming signal may be adjusted so that a state separation that separates data values of the page 116 is sufficient to recover the data values of the page 116 (e.g., after a power-up event at the data storage device 102).

In a particular embodiment, the programming signal adjustor 148 is configured to access the backup power source 154 to adjust the programming signal. The backup power source 154 may be configured to provide backup power to the programming signal adjustor 148 in response to the power drop to extend a time duration during which one or more of the storage elements 110-113 can be selectively programmed (e.g., while the power supply voltage 132 is falling and before the data storage device 102 enters an "off" mode of operation). The backup power source 154 may include a capacitive device (e.g., one or more capacitors), a backup battery, one or more other devices, or a combination thereof, as illustrative examples. Although FIG. 1 depicts that the backup power source 154 is included in the controller 138, the backup power source 154 may be located elsewhere in the system 100.

The non-volatile memory 104 may include multiple voltage detectors. As described above, the voltage detector 120 may be configured to initiate selective programming of one or more of the storage elements 110-113 in response to detecting that a power supply voltage is less than a first threshold. The non-volatile memory 104 may further include a second voltage detector. The second voltage detector may be configured to cause the non-volatile memory 104 to terminate programming operations in response to detecting that a power supply voltage is less than a second threshold (e.g., in connection with a "soft reset" operation). The second threshold is less than the first threshold. To illustrate, the first threshold may correspond to a voltage level of a power supply voltage that indicates a power-off event is likely imminent, and the second threshold may correspond to a voltage level that indicates programming operations can no longer be performed safely at the non-volatile memory 104. Although FIG. 1 indicates that the voltage detector 120 is included in the non-volatile memory 104, the voltage detector 120 and/or the second voltage detector may be included in the controller 138 without departing from the scope of the present disclosure. As additional examples, both of the voltage detectors 120, 142 can be included in the non-volatile memory 104, or both of the voltage detectors 120, 142 can be included in the controller 138.

By selectively programming one or more storage elements of a word line of the data storage device 102, a state separation that separates data values of a page can be increased. For example, instead of terminating write operations as soon as a power drop is detected (as done by certain conventional devices), the data storage device 102 may selectively program storage elements to increase the state separation of the page, enabling subsequent recovery of the page. Accordingly, the page can be recovered upon power-up of the data storage device 102 without backing up bits of the page and without utilizing conventional LMB and BCF techniques. Instead, one or more techniques described herein may be selectively applied (e.g., by increasing a state separation of a page in response to a power down, rather than always backing up data or always utilizing an LMB technique or a BCF technique irrespective of whether or not a power down occurs). Performance of the system 100 is therefore improved by conserving operational resources of the data storage device 102 (e.g., by using fewer write operations relative to certain conventional techniques).

Figure 2:
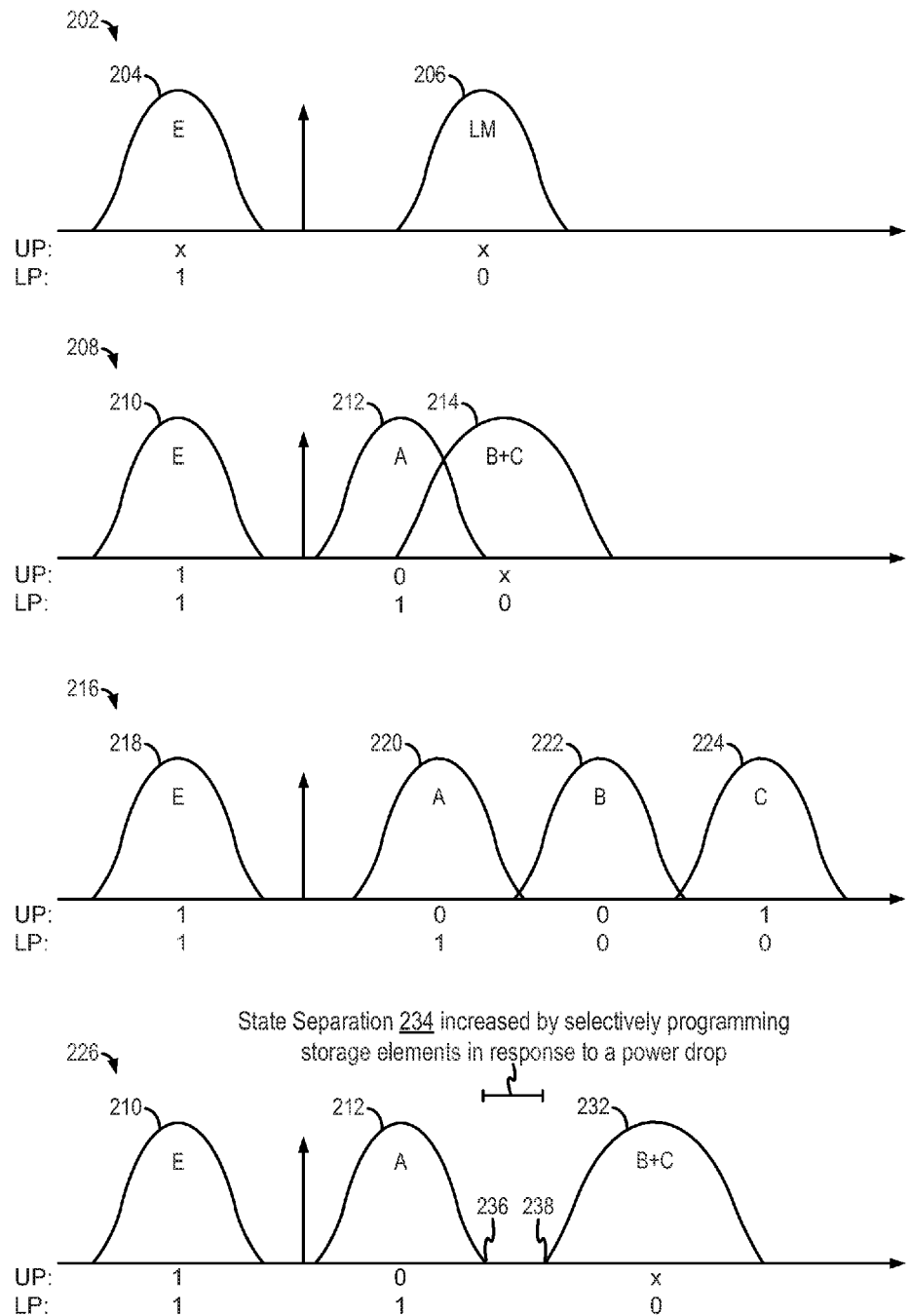
FIG. 2 illustrates certain example threshold voltage distributions and a state separation that enables recovery of data after a power drop at the data storage device of FIG. 1.

FIG. 2 illustrates histograms 202, 208, 216, and 226 that indicate distributions of threshold voltages that can be programmed to the non-volatile memory 104. In FIG. 2, each abscissa may indicate threshold voltages of storage elements of the non-volatile memory 104, and each ordinate may indicate a number of storage elements of the non-volatile memory 104 having a particular threshold voltage. In a particular embodiment, each of the histograms 202, 208, 216, and 226 corresponds to a particular operational state of the word line 106.

For example, the histogram 202 includes a distribution 204 and a distribution 206. The distributions 204, 206 indicate threshold voltages stored at the word line 106. For example, the distribution 204 may correspond to a first data value of the page 116, and the distribution 206 may correspond to a second data value of the page 116. The distributions 204, 206 may correspond to a lower page (LP) that is written to the word line 106 in connection with a multi-stage write process (e.g., prior to programming an upper page at the word line 106). In the example of FIG. 2, the distribution 204 corresponds to an erase ("E") state associated with a data value of "1," and the distribution 206 corresponds to an "LM" state associated with a data value of "0." It should be appreciated that the particular example of FIG. 2 is illustrative and that the techniques described herein are applicable to a variety of implementations, such as implementations with bit conventions and/or state conventions other than those depicted in FIG. 2.

The histogram 208 corresponds to an operational state of the data storage device 102 after programming the lower page and during programming of an upper page (UP). The upper page may correspond to the page 117. The histogram 208 includes distributions 210, 212, and 214. The distribution 212 may be generated by programming storage elements corresponding to the distribution 204. That is, storage elements storing an "E" state threshold voltage associated with the distribution 204 may be programmed to store an "A" state threshold voltage associated with the distribution 212. Further, the distribution 214 may be generated by programming storage elements corresponding to the distribution 206. That is, storage elements storing an "LM" state threshold voltage associated with the distribution 206 may be programmed to store a "B" state threshold voltage or a "C" state threshold voltage associated with the distribution 212. In FIG. 2, the "E" and "A" state threshold voltages correspond to a lower page data value of "1," and the "B" and "C" state threshold voltages correspond to a lower page data value of "0."

If a power drop does not occur while the data storage device 102 has the operational state indicated by the histogram 208 and programming of the upper page is completed, an operational state of the word line of the data storage device 102 may correspond to the histogram 216. The histogram 216 includes distributions 218, 220, 222, and 224. In the example of FIG. 2, programming of the distribution 212 has been completed, resulting in the distribution 220. Programming of the distribution 214 has been completed, resulting in the distributions 222, 224, which correspond to "B" state threshold voltages and "C" state threshold voltages, respectively. The distributions 218, 220 may correspond to a lower page data value of "1," and the distributions 222, 224 may correspond to a lower page data value of "0." The distributions 218, 224 may correspond to an upper page data value of "1," and the distributions 220, 222 may correspond to an upper page data value of "0."

Alternatively, if a power drop occurs while the data storage device 102 has the operational state indicated by the histogram 208, programming of the upper page may be interrupted. As a result, certain bits of the lower page may be corrupted. For example, because the distributions 212, 214 may partially overlap (as illustrated in FIG. 2), threshold voltages within the overlap may correspond to a lower page data value of either "1" or "0." Further, a size of the overlap may exceed an error correction capability of the ECC engine 146, resulting in loss of data of the lower page.

Accordingly, in response to a power drop at the data storage device 102, the data storage device 102 may selectively program storage elements to enable recovery of the lower page data values. The histogram 226 illustrates an operational state of the data storage device in which a state separation 234 has been increased by selectively programming storage elements in response to a power drop. The word line of the data storage device 102 may have the operational state corresponding to the histogram 226 upon power-up after the power drop.

The histogram 226 illustrates that storage elements storing threshold voltages corresponding to the distribution 214 have been selectively programmed in response to the power drop, resulting in a distribution 232. In the histogram 226, the distributions 210, 212 have not been programmed after the power drop relative to the histogram 208. To illustrate, the data storage device 102 may inhibit programming of storage elements storing threshold voltages corresponding to the distributions 210, 212 in response to the power drop.

By selectively programming storage elements in response to the power drop, the state separation 234 is increased. For example, the state separation 234 separates a highest threshold voltage 236 of the distribution 212 from a lowest threshold voltage 238 of the distribution 232. Accordingly, lower page data values of "1" may be separated from lower page data values of "0," enabling recovery of the lower page data values. In other embodiments, lower page data may be recovered even if the distributions 212, 232 overlap. For example, the lower page may be decodable by the ECC engine 146 provided that the overlap is decreased to within a particular error correction capability of the ECC engine 146. In these cases, "state separation" as used herein may indicate a difference between a median value (or approximate median value) of the distribution 212 and a median value (or approximate median value) of the distribution 232.

One or more techniques described herein may be applied to enable recovery of both the lower page and the upper page, or to enable recovery of only the lower page. For example, in the example of the histogram 226, the distribution 232 does not include a separation between "B" states and "C" states (i.e., "B" states and "C" states are grouped within the distribution 232). Accordingly, the histogram 226 may correspond to a "fast" separation increase technique used by the controller 138 to increase the state separation 234 to enable recovery of the lower page. In a particular embodiment, the controller 138 applies the fast separation increase technique when a copy of the upper page is stored (e.g., cached) elsewhere in the system 100, such as at a recovery block of the non-volatile memory, at the RAM 144, at another location, or a combination thereof. Alternatively, the controller 138 may be configured to cause or increase a state separation between "B" states and "C" states of the distribution 232 in response to the power drop in addition to increasing the state separation 234. Such a state separation between "B" states and "C" states of the distribution 232 may enable recovery of the upper page by distinguishing data values of the upper page.

In a particular illustrative embodiment, the controller 138 may delay programming of the distribution 212 while programming the upper page. For example, to reduce the overlap described with reference to the histogram 208, the controller 138 may initiate programming of storage elements selected to store an "A" state threshold voltage after initiating programming of storage elements selected to store a "B" state threshold voltage or a "C" state threshold voltage, increasing separation between the distributions 212, 214. Accordingly, the state separation 234 may be increased by delaying programming of the distribution 212. Alternatively or in addition, the controller 138 may slow programming of the distribution 212 while programming the upper page, such as by adjusting bit line voltages of storage elements selected to store an "A" state threshold voltage in order to slow programming of the distribution 212.

The techniques described with reference to FIG. 2 may be selectively applied to enable recovery of data in case of a power drop. For example, if no power drop is detected while writing the upper page of FIG. 2, then backing up of data and other conventional techniques may be unnecessary. By increasing the state separation 234 in response to a power drop, data can be recovered without backing up large amounts of data and without using "intermediate" programming operations, thus freeing storage space and/or computational resources and improving performance of the system 100.

Figure 3:
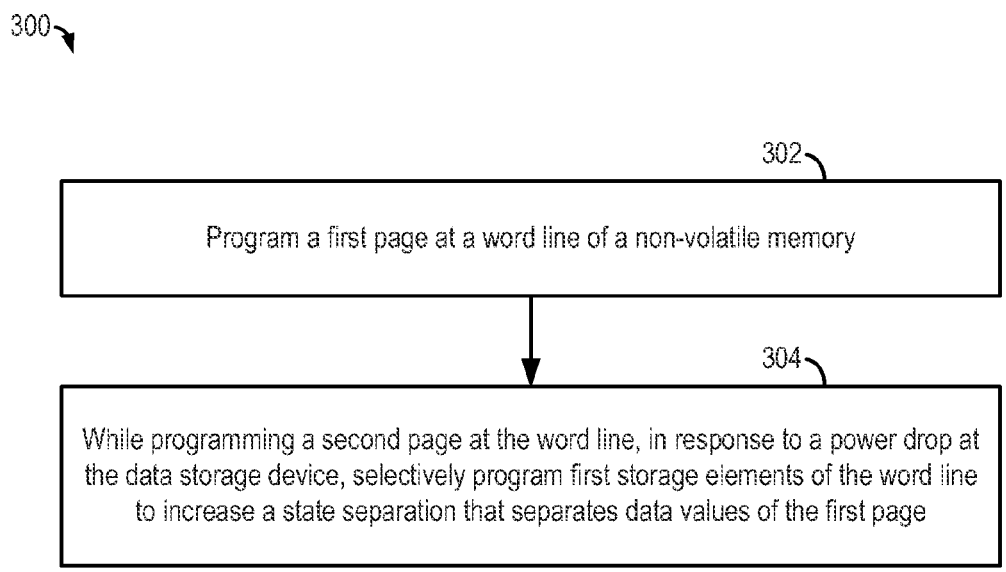
FIG. 3 is a flow diagram illustrating an example method of operation of the data storage device of FIG. 1.

Referring to FIG. 3, a particular illustrative embodiment of a method is depicted and generally designated 300. The method 300 may be performed in the data storage device 102, such as by the non-volatile memory 104, by the controller 138, or a combination thereof.

The method 300 may include programming a first page at a word line of the non-volatile memory 104, at 302. The first page may correspond to the page 116, and the word line may correspond to the word line 106, as illustrative examples.

The method 300 may further include selectively programming first storage elements of the word line to increase a state separation that separates data values of the first page, at 304. The first storage elements may be selectively programmed in response to a power drop at the data storage device 102 while programming a second page at the word line. The power drop may correspond to a power-down event at the data storage device 102. The second page may correspond to the page 117, and the state separation may correspond to the state separation 234. In a particular illustrative embodiment, the controller 138 increases the state separation by issuing one or more commands instructing the non-volatile memory 104 to program the first page using an increased voltage control gate LM-state verify (VCG-AV1) parameter (e.g., by issuing a command to verify programming of the page 116 using an increased verify voltage).

To further illustrate, in a particular embodiment, the second storage elements correspond to storage elements that are selected to be programmed to a lowest threshold voltage state or to a second lowest threshold voltage state. The lowest threshold voltage state may correspond to the distribution 218, and the second lowest threshold voltage state may correspond to the distribution 220, as illustrative examples. The first storage elements may correspond to storage elements that are selected to be programmed to a second highest threshold voltage state or to a highest threshold voltage state. The highest threshold voltage state may correspond to the distribution 224, and the second highest threshold voltage state may correspond to the distribution 222, as illustrative examples.

The method 300 of FIG. 3 may increase a state separation that separates data values of a page in response to a power drop. For example, overlap between distributions indicating different bit values of the page may be reduced or avoided using the method 300. Accordingly, the method 300 may enable recovery of the data values of the page, improving performance and reducing or avoiding data loss at a data storage device, such as the data storage device 102.

Figure 4:
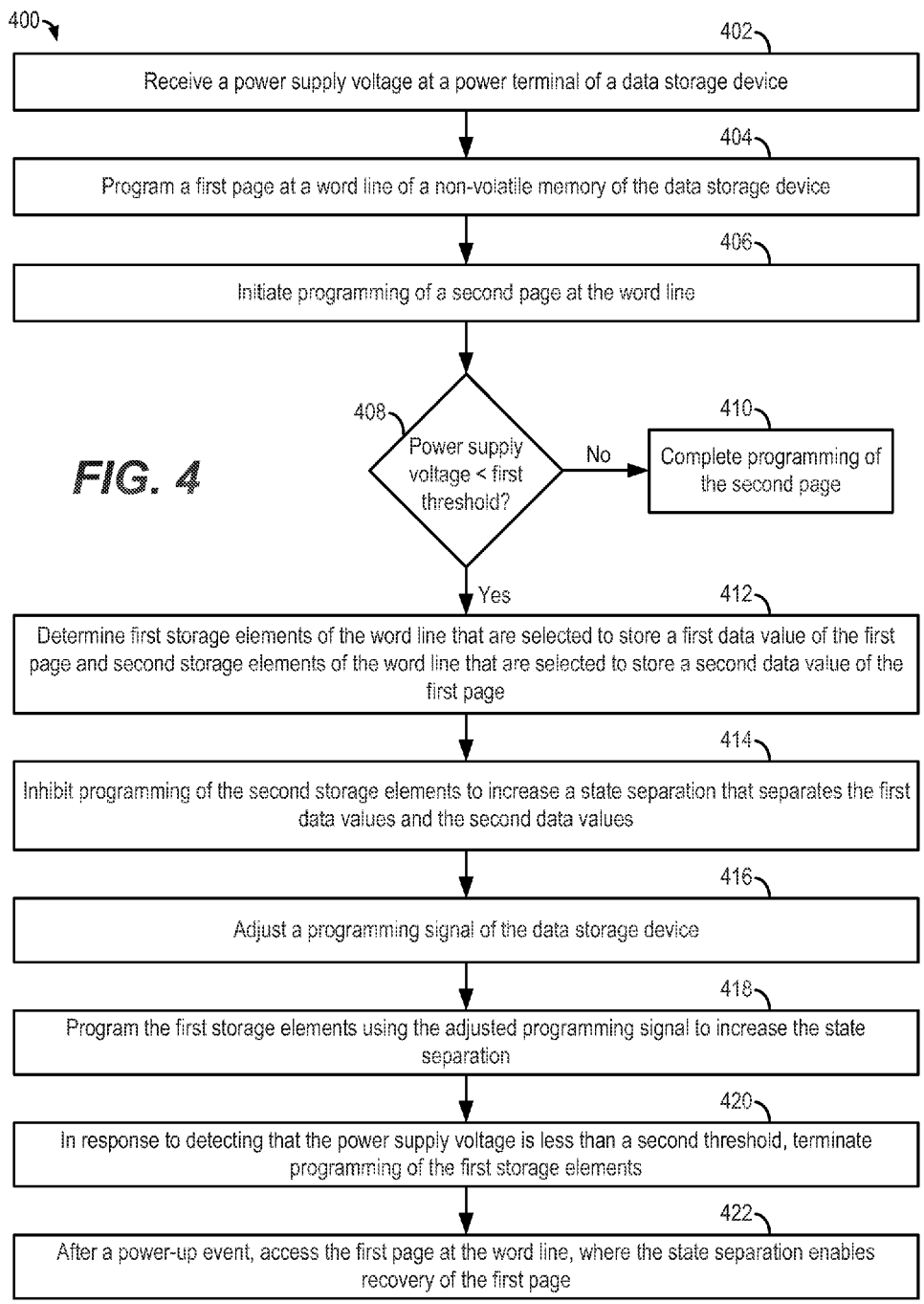
FIG. 4 is a flow diagram illustrating another example method of operation of the data storage device of FIG. 1.

Referring to FIG. 4, a particular illustrative embodiment of a method is depicted and generally designated 400. The method 400 may be performed in the data storage device 102, such as by the non-volatile memory 104, by the controller 138, or a combination thereof.

The method 400 includes receiving a power supply voltage at a power terminal of a data storage device, such as the data storage device 102, at 402. The power supply voltage may correspond to the power supply voltage 132, and the power terminal may correspond to the power terminal 128, as illustrative examples.

The method 400 may further include programming a first page of a word line of a non-volatile memory, such as the non-volatile memory 104, at 404. The word line may correspond to the word line 106, and the first page may correspond to the page 116, as illustrative examples. The first page may be programmed in connection with a multi-stage write process of a multi-level cell (MLC) programming technique. For example, the page 116 may be programmed during multiple write operations that target the word line 106 based on multiple write commands sent by the controller 138 to the non-volatile memory 104. The page 116 may be programmed responsive to a first write command of the multiple write commands.

The method 400 may further include initiating programming of a second page at the word line, at 406. For example, the controller 138 may send to the non-volatile memory 104 the page 117 and a second command to write the page 117 at the word line 106. The non-volatile memory 104 may initiate writing the page 117 at the word line 106.

The method 400 may include determining whether a power drop has occurred. For example, a determination may be made whether a power supply voltage is less than a first threshold, at 408. The power supply voltage may correspond to the power supply voltage 132 (or to a power or voltage detected by the voltage detector 120 or the voltage detector 142). The first threshold may correspond to a voltage level of the power supply voltage that indicates a power off event is likely to occur. In an illustrative configuration, the first threshold is approximately 85 to 90 percent of a normal or expected operating range of the power supply voltage (e.g., a power drop from 3.3 volts to 2.9 volts or less, or a power drop from 2.8 volts to 2.4 volts or less, as illustrative examples), though the particular threshold used depends on the particular application. The power drop may be detected by the voltage detector 120, the voltage detector 142, or another voltage detector of the data storage device 102. If no power drop is detected, then programming of the second page may be completed, at 410.

If a power drop is detected, the method 400 further includes determining first storage elements of the word line that are selected to store a first data value of the first page and second storage elements of the word line that are selected to store a second data value of the first page, at 412. For example, the first storage elements may include storage elements of the word line that are selected to store a "0" data value of the first page, such as storage elements of the word line that correspond to the distribution 214. The second storage elements may include storage elements of the word line that are selected to store a "1" data value of the first page, such as storage elements of the word line that correspond to the distributions 210, 212.

The method 400 may further include inhibiting programming of the second storage elements to increase a state separation that separates the first data values and the second data values, at 414. The state separation may correspond to the state separation 234.

The method 400 may further include adjusting a programming signal of the data storage device 102, at 416. For example, the programming signal adjustor 148 may adjust the programming signal by increasing a number of programming pulses of the programming signal, by increasing a magnitude of one or more of the programming pulses, by decreasing a duration of one or more of the programming pulses, or a combination thereof. Alternatively or in addition, backup power from the backup power source 154 may be provided to the programming signal adjustor 148, such as to increase a magnitude of the programming pulses.

The method 400 may further include selectively programming first storage elements of the word line using the adjusted programming signal to increase the state separation, at 418. In a particular embodiment, the first storage elements are programmed without using a verify signal (e.g., use of the verify signal at the word line may temporarily cease in response to the power drop). To further illustrate, in some circumstances, a storage element selected to store a "B" state threshold voltage may store a greater threshold voltage (e.g., a "C" state threshold voltage) as a result of increasing the state separation.

The method 400 may further include terminating programming of the first storage elements in response to detecting that the power supply voltage is less than a second threshold, at 420. The second threshold is less than the first threshold. Detecting that the power supply voltage is less than the second threshold may be performed by the voltage detector 120 or by another voltage detector of the data storage device 102, such as the second threshold detector described with reference to FIG. 1. The second threshold may correspond to a voltage level of the power supply voltage at which data can no longer be safely written to the non-volatile memory 104.

The method 400 may further include accessing the first page at the word line after a power-up event, at 422. The state separation enables recovery of the first page. As a particular example, if the word line is sensed using a read threshold that is between the threshold voltages 236, 238, then storage elements of the word line that are programmed to a threshold voltage less than the read threshold may be determined to store a "1" data value associated with the first page, and storage elements of the word line that are programmed to a threshold voltage greater than the read threshold may be determined to store a "0" data value associated with the first page. The read threshold may be determined using a suitable technique, such as a cell voltage distribution (CVD) tracking technique and/or a repetitive bit error rate (BER) estimation technique. In a particular illustrative embodiment, the controller 138 is configured to relocate the first page to a recovery block of the data storage device 102 that stores the second page, and the first page and the second page are re-written to the word line 106, written to another word line of the non-volatile memory 104, or a combination thereof.

By programming the first storage elements and inhibiting programming of the second storage elements, a state separation that separates data values of a page can be increased. Accordingly, the page can be recovered upon power-up of the data storage device 102 without backing up bits of the page and without utilizing an "intermediate" write stage, improving performance of the data storage device 102.

It will be appreciated that although one or more components described herein are illustrated as block components and described in general terms, such components may include one or more microprocessors, state machines, or other circuits configured to enable the controller 138 and the non-volatile memory 104 (or one or more components thereof) to perform operations described herein. For example, one or more components described herein may correspond to one or more physical components, such as hardware controllers, state machines, logic circuits, one or more other structures, or a combination thereof, to enable the controller 138 to perform one or more operations described herein. One or more aspects of the controller 138 may be implemented using a microprocessor or microcontroller programmed to perform operations described herein, such as one or more operations corresponding to the methods 300, 400. In a particular embodiment, the controller 138 includes a processor executing instructions that are stored at the non-volatile memory 104. Alternatively or in addition, executable instructions that are executed by the processor may be stored at a separate memory location that is not included in the non-volatile memory 104, such as at a read-only memory (ROM) that is external to the non-volatile memory 104.

As a particular illustrative example, the controller 138 may receive the data 152 from the host device 136 via the I/O portion 122 and the host interface 140. The controller 138 may receive an instruction to write the data 152 at the non-volatile memory 104. The controller 138 may receive the instruction from the host device 136 via the I/O portion 122 and the host interface 140. The controller 138 may send the data 152 to the ECC engine 146 to cause the ECC engine 146 to generate one or more ECC codewords, which may correspond to the pages 116, 117. The ECC engine 146 may output the pages 116, 117, and the controller 138 may send the page 116 and a first write instruction to the non-volatile memory 104, such as via a bus and/or one or more other structures. The first write instruction may include an address of the word line 106.

In response to the write instruction, the non-volatile memory 104 may write the page 116 at the word line 106 and may send a confirmation message or other signal to the controller 138 indicating that the page 116 has been successfully stored at the word line 106. In response to the confirmation message or other signal, the controller 138 may send the page 117 and a second write instruction to the non-volatile memory 104. The second write instruction may include the address of the word line 106. In response to the second write instruction, the non-volatile memory 104 may initiate writing the page 117 at the word line 106. If a power drop is detected (e.g., by either of the voltage detectors 120, 142) while the page 117 is being written at the word line 106, an instruction or other signal may be issued to cause the non-volatile memory 104 to increase a state separation that separates data values of the page 116. In accordance with a first example, the voltage detector 120, in response to detecting the power drop, sends a signal that causes the non-volatile memory 104 to increase the state separation. In accordance with a second example, the controller 138 sends a general purpose write protect command to the non-volatile memory 104 in response to the voltage detector 142 detecting the power drop. In accordance with a third example, the controller 138 sends the dedicated command 150 to the non-volatile memory 104 in response to the voltage detector 142 detecting the power drop. It should be appreciated that the foregoing example operation is provided for illustrative purposes and is not intended to limit the scope of the disclosure.

In a particular embodiment, the data storage device 102 may be attached to or embedded within one or more host devices, such as within a housing of a host communication device, which may correspond to the host device 136. For example, the data storage device 102 may be integrated within a packaged apparatus, such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 136. In a particular embodiment, the data storage device 102 may include a non-volatile memory, such as a three-dimensional (3D) memory, a flash memory (e.g., a NAND memory, a NOR memory, an MLC memory, a divided bit-line NOR (DINOR) memory, an AND memory, a high capacitive coupling ratio (HiCR) device, an asymmetrical contactless transistor (ACT) device, or one or more other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    in a data storage device including a non-volatile memory that includes a three-dimensional (3D) memory and circuitry associated with operation of memory cells of the 3D memory, performing:
        programming a first page at a word line of the non-volatile memory; and
        while programming a second page at the word line, in response to a power drop at the data storage device, selectively programming first storage elements of the word line to increase a state separation that separates data values of the first page.

2. The method of claim 1, wherein the first storage elements are selected to store a first data value of the data values, and further comprising:
    in response to the power drop, determining second storage elements of the word line that are selected to store a second data value of the data values; and
    inhibiting programming of the second storage elements to increase the state separation.

3. The method of claim 2, wherein the second storage elements are each selected to be programmed to a lowest threshold voltage state or to a second lowest threshold voltage state, and wherein the first storage elements are each selected to be programmed to a second highest threshold voltage state or to a highest threshold voltage state.

4. The method of claim 1, wherein the word line has a multi-level cell (MLC) configuration, wherein the first page corresponds to a lower page, and wherein the state separation distinguishes a first data value of the data values from a second data value of the data values.

5. The method of claim 1, wherein the non-volatile memory includes a voltage detector, and wherein the power drop is detected by the voltage detector.

6. The method of claim 1, wherein the data storage device further includes a controller coupled to the non-volatile memory, wherein the controller includes a voltage detector, and wherein the power drop is detected by the voltage detector.

7. The method of claim 6, further comprising sending, by the controller, a write protect signal to the non-volatile memory in response to detecting the power drop to cause the non-volatile memory to increase the state separation.

8. The method of claim 6, further comprising sending, by the controller, a dedicated command to the non-volatile memory in response to detecting the power drop, wherein the dedicated command causes the non-volatile memory to increase the state separation.

9. The method of claim 1, further comprising adjusting a programming signal in response to the power drop, wherein the first storage elements are selectively programmed using the adjusted programming signal.

10. The method of claim 9, wherein the programming signal is adjusted by modifying a number of programming pulses of the programming signal, by modifying a magnitude of the programming pulses, by modifying a duration of the programming pulses, or a combination thereof.

11. The method of claim 9, wherein the data storage device includes a backup power source, and wherein the adjusted programming signal is powered using the backup power source.

12. The method of claim 9, wherein in response to the power drop, the first storage elements are programmed without using a verify signal.

13. The method of claim 1, wherein the power drop corresponds to a power-off event.

14. The method of claim 13, further comprising accessing the first page at the word line after a power-up event following the power drop, wherein the state separation enables recovery of the first page.

15. A data storage device comprising:

a controller; and a non-volatile memory coupled to the controller and including a three-dimensional (3D) memory and circuitry associated with operation of memory cells of the 3D memory, wherein the non-volatile memory includes a word line, and wherein the non-volatile memory is configured, in response to a power drop while programming a second page at the word line, to selectively program first storage elements of the word line to increase a state separation that separates data values of a first page at the word line.

16. The data storage device of claim 15, further comprising:

a power terminal, wherein the power terminal is configured to receive a power supply voltage; and a first voltage detector, wherein the first voltage detector is configured to detect the power drop by detecting that the power supply voltage is less than a first threshold.

17. The data storage device of claim 16, further comprising a second voltage detector, wherein the second voltage detector is configured to detect that the power supply voltage is less than a second threshold that is less than the first threshold, and wherein the non-volatile memory is further configured, in response to the power supply voltage being less than the second threshold, to terminate programming of the word line.

18. The data storage device of claim 17, wherein the non-volatile memory includes one or both of the first voltage detector and the second voltage detector.

19. The data storage device of claim 17, wherein the controller includes one or both of the first voltage detector and the second voltage detector.

20. The data storage device of claim 17, wherein the non-volatile memory includes one of the first voltage detector and the second voltage detector, and wherein the controller includes the other of the first voltage detector and the second voltage detector.

* * * * *